United States Patent [19]
Koshikawa

[11] Patent Number: 6,061,294
[45] Date of Patent: *May 9, 2000

[54] SYNCHRONOUS SEMICONDUCTOR MEMORY DEVICE AND METHOD OF CONTROLLING SENSING PROCESS OF SYNCHRONOUS DYNAMIC RAM

[75] Inventor: Yasuji Koshikawa, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/813,210

[22] Filed: Mar. 7, 1997

Related U.S. Application Data

[63] Continuation of application No. 08/543,144, Oct. 13, 1995, abandoned.

[30] Foreign Application Priority Data

Oct. 31, 1994 [JP] Japan .................................. 6-267212

[51] Int. Cl.$^7$ ...................................................... G11C 7/00
[52] U.S. Cl. .................... 365/233; 365/189.05; 365/194; 365/230.03; 365/230.08
[58] Field of Search ............................. 365/233, 230.03, 365/230.08, 189.05, 194

[56] References Cited

U.S. PATENT DOCUMENTS

5,471,607  11/1995  Garde ................................... 365/233 X
5,473,565  12/1995  Kusakari .............................. 365/233 X

FOREIGN PATENT DOCUMENTS

61-148692  7/1986  Japan .
6-76566    3/1994  Japan .

*Primary Examiner*—Do Hyun Yoo
*Attorney, Agent, or Firm*—Foley & Lardner

[57] ABSTRACT

A synchronous semiconductor memory device has a plurality of banks each including a cell array. A sensing process of the synchronous semiconductor memory device is controlled by starting a series of operations from selection of a row address to a sensing operation in response to a first external clock pulse, and synchronizing at least one event in the series of operation with a second external clock pulse subsequent to the first external clock pulse.

4 Claims, 7 Drawing Sheets

SYNCHRONOUS SEMICONDUCTOR MEMORY DEVICE AND METHOD OF CONTROLLING SENSING PROCESS OF SYNCHRONOUS DYNAMIC RAM

This application is a continuation of application Ser. No. 08/543,144, filed Oct. 13, 1995, now abandoned.

BACKGROUND OF THE INVENTION

1. Field of the Invention

The present invention relates to a synchronous semiconductor memory device, and more particularly to a method of controlling the sensing process of a synchronous dynamic RAM (random access memory).

2. Description of the Prior Art

In recent years, there have been growing demands for higher-speed semiconductor memory devices with the advent of higher-speed CPUs. However, such demands have not been necessarily met because of physical limitations posed on minituarization processes and increased chip sizes caused by greater storage capacities. One of solutions to this problem is a synchronous semiconductor memory device having an internal pipelining structure as proposed in Japanese Patent Laid-Open Nos. 148692/86 and 76566/94 entitled "Semiconductor memory device".

There has also been proposed a synchronous semiconductor memory device having a plurality of internal banks for preventing a time loss owing to a precharge time (rRP) inherent in dynamic RAMs and improving memory performance.

FIG. 1 of the accompanying drawings shows an example of such a conventional synchronous semiconductor memory device. As shown in FIG. 1, the synchronous semiconductor memory device comprises an internal clock generator 1 for being supplied with signals from external terminals CLK, CKE and outputting an internal clock signal ICUL, an address latch circuit 5 for being supplied with signals from a plurality of external address terminals ADD, All and an external terminal CSB and outputting an address signal IADD in synchronism with the internal clock signal ICLK, a command decoder 6 for being supplied with signals from external terminals CSB, RASB, CASB, WEB, DQM and an external address terminal All and outputting internal signals ARAS, BRAS (row selection control signals), CAS (column selection control signal), READ (read signal), WRITE (write signal), and BANK (bank activating signal) in synchronism with the internal clock signal ICLK, a row address buffer 2 for being supplied with the address signal IADD and the internal signals ARAS, BRAS and outputting a row address signal XADD, a column address buffer 3 for being supplied with the address signal IADD and the internal signal CAS and outputting an address signal YADD1, a column address decoder 4 for being supplied with the address signal YADD1 and outputting an address signal YADD2, a data amplifier activating circuit 7 for being supplied with the internal signal READ and outputting an internal signal DE in synchronism with the internal clock signal ICLK, a write-in buffer 18 for being supplied with write data from an external terminal DQ and outputting an internal signal DI, a latch circuit 16 for being supplied with the internal signals DI, WRITE and outputting write data to an internal-bus-pair RW bus 19 (used to transmit both write and read data) in synchronism with the internal clock signal ICLK, a latch circuit 15 for latching data on the internal-bus-pair RW bus 19 in synchronism with the internal clock signal ICLK, a write-out buffer 17 for being supplied with latched data DO from the latch circuit 15 in response to the internal signal READ and outputting the latched data DO to the external terminal Q,. a bank 100 for being supplied with the address signal XADD, YADD2, the internal clock signal ICLK, the internal signals ARAS, DE, BANK, and data from the internal-bus-pair RW bus 19, and a bank 200 for being supplied with the address signal XADD, YADD2, the internal clock signal ICLK, the internal signals BRAS, DE, an inverted signal of the internal signal BANK, and data from the internal-bus-pair RW bus 19.

The bank 100 comprises a cell array 11, a delay element DL2 for being supplied with the internal signal ARAS and outputting an internal signal XE, a delay element DL1 for being supplied with the internal signal XE and outputting an internal signal SE, a row address decoder 9 for being supplied with the address signal XADD and the internal signal XE and selecting a row selecting line WL, a latch circuit 8 for being supplied with the address signal YADD2 and the internal signal BANK and selecting a bit line pair BL in synchronism with the internal clock signal ICLK, a write amplifier 14 for being supplied with data from the internal-bus-pair RW bus 19 and the internal signal BANK and outputting an internal signal WI, a sense amplifier 12 for being supplied with the internal signals WI, SE and the bit line pair BL and outputting an internal signal RO, and a data amplifier 13 for being supplied with the internal signals RO, DE, BANK and outputting read data to the internal-bus-pair RW bus 19.

The bank 200 is of substantially the same structure as the bank 100 except that the bank 200 is supplied with the internal signal BRAS rather than the internal signal ARAS and with the inverted signal of the internal signal BANK rather than the internal signal BANK. Those parts of the bank 200 which are identical to those of the bank 100 are denoted by identical reference numerals.

A read data path used to carry data ranging from the inputting of column addresses to the outputting of read data is of a three-stage pipeline structure synchronous with the external clock signal CLK, including a first pipeline stage from the address latch circuit 5 to the latch circuit 8, a second pipeline stage from the latch circuit 8 to the latch circuit 15, and a third pipeline stage from the latch circuit 15 to the external terminal DQ. A write data path is of a pipeline structure synchronous with the external clock signal CLK, including a first pipeline stage from the external terminal DQ to the latch circuit 16 and a second pipeline stage from the latch circuit 16 to the sense amplifier 12. From the second pipeline stage up to the memory cell, data are written asynchronously with the external clock signal CLK.

Operation of the synchronous semiconductor memory device shown in FIG. 1 will be described below.

FIG. 2 of the accompanying drawings shows the waveforms of various signals, illustrating a data reading process in which a burst length is 1 and a CAS latency (the number of clock cycles required from a read command to the outputting of data) is 3.

Upon a positive-going edge of the external clock signal CLK in a cycle C1, the external terminals CKE, CSB, RASB, CASB, WEB, and DQM are of high, low, low, high, high, and low levels, respectively, producing an active command, and the bank selecting address terminal All is of a low level, selecting the bank 100. The bank 100 is now rendered active. At this time, the row address is ADD1, and a corresponding row selecting line WL is selected over an interval from the cycle C1 to a cycle C3, effecting a sensing process. In a cycle C4, the bank selecting address terminal All is of a high level, and an active command is inputted to the bank 200. A corresponding row selecting line WL is selected over an interval from cycle C4 to a cycle C6, effecting a sensing process.

In a cycle C5, the external terminals CKE, CSB, RASB, CASB, WEB, and DQM and the bank selecting address terminal All are of high, low, high, low, high, low, and low levels, respectively. When a read command is inputted to the bank 100, data at a column address ADD3 is read in synchronism with the external clock signal CLK over an interval from the cycle C5 to a cycle C7, and outputted to the external terminal DQ in the cycle C7.

In the cycle C6, the external terminals CKE, CSB, RASB, CASB, WEB, and DQM and the bank selecting address terminal All are of high, low, low, high, low, low, and low levels, respectively. When a precharge command is inputted to the bank 100, data is precharged in the memory cell over an interval from the cycle 6 to a cycle 8.

In the cycle 7, the external terminals CKE, CSB, RASB, CASB, WEB, and DQM and the bank selecting address terminal All are of high, low, high, low, high, low, and high levels, respectively. When a read command is inputted to the bank 200, data is read in synchronism with the external clock signal CLK over an interval from the cycle 7 to a cycle 9, and outputted to the external terminal DQ in the cycle 9.

In the cycle C9, the external terminals CKE, CSB, RASB, CASB, WEB, and DQM and the bank selecting address terminal All are of high, low, low, high, low, low, and high levels, respectively. When a precharge command is inputted to the bank 200, data is precharged in the memory cell over an interval from the cycle 9 to a cycle 11.

Each of the active and precharge operations is asynchronous with the external clock signal CLK, but requires a period of time which is as long as three cycles of the external clock signal CLK, and the read operation requires three clock cycles as it is in synchronism with the external clock signal CLK. While in the active and precharge operations, it is possible to read data from the other bank in which a sensing process has already been completed, for thereby concealing a precharge time (tRP) inherent in dynamic RAMs and improving memory performance.

An example of concurrent operation of the two banks is shown in FIG. 3 of the accompanying drawings which illustrates the waveforms of signals from the cycle C4 to the cycle C6.

After an active command is inputted to the bank 200 in the cycle C4, the internal signal XE goes high with a certain delay, selecting a row selecting line WL and developing a differential potential depending on the memory cell data between the bit line pair. The internal signal SE then goes high with a certain delay from the internal signal XE, amplifying the differential potential between the bit line pair. When a read command is inputted to the bank 100 in the cycle C5 concurrent with the above sensing operation, the internal signal READ goes high, starting to read data from the bank 100.

Another conventional semiconductor memory device which is analogous to the above conventional arrangement is disclosed in Japanese Patent Laid-Open No. 195382/82. According to the disclosed semiconductor memory device, precharge and sense clock signals are generated using an internal clock signal for controlling operation of a synchronous static RAM. In the synchronous static RAM, the internal clock signal and the precharge and sense clock signals are generated also from an external clock signal when a command for starting a precharging or sensing process is inputted.

In the conventional synchronous semiconductor memory device, an active operation ranging from the selection of a row selecting line to the completion of a sensing process is carried out over a plurality of clock cycles asynchronously with an external clock signal after an active command has been inputted, and, in a next cycle following the inputting of the active command, a read command is inputted to the other bank where a sensing process has already been completed, starting to read data from the other bank. Therefore, while the differential potential between the bit line pair in the active operation is very small, noise generated in the read operation of the other bank is superposed on the bit line pair, possibly inverting the differential potential between the bit line pair. Since the read operation is started from a next cycle following an active command inputting cycle whereas the bit line pair starts to be controlled with a certain delay time from the active command inputting cycle, noise tends to affect the bit line pair differently depending on the frequency (cycle time) of the external clock signal.

For sorting out synchronous semiconductor memory devices into those acceptable and those defective, the synchronous semiconductor memory devices have to be tested with slightly different frequencies (cycle times), and hence the tests consume a long period of time. Inasmuch as the number of banks used tends to be increased because of larger storage capacities required by synchronous semiconductor memory devices, the number of combinations of banks that operate concurrently is also increased. Therefore, the period of time consumed by the tests and hence the cost of the tests are also increased.

Another problem is that defects of synchronous semiconductor memory devices cannot completely be detected even if they are subjected to many tests with slightly different frequencies (cycle times).

SUMMARY OF THE INVENTION

It is an object of the present invention to provide a synchronous semiconductor memory device and a method of controlling the sensing process of such a synchronous semiconductor memory device in which the effect on a bank of noise produced by the operation of another bank does not depend on the frequency of an external clock signal.

According to an aspect of the present invention, there is provided a method of controlling a sensing process of a synchronous semiconductor memory device having a plurality of banks each including a cell array, comprising the steps of starting a series of operations from selection of a row address to a sensing operation in response to a first external clock pulse, and synchronizing at least one event in the series of operations with a second external clock pulse subsequent to the first external clock pulse.

The row address may be selected in synchronism with the second external clock pulse. The sensing operation may be started in synchronism with either the second external clock pulse or a third external clock pulse subsequent to the second external clock pulse. The series of operations may be started in response to the first external clock pulse in the first bank, and an operation different from the series of operations started in the first bank may be started in response to the second external clock pulse or the third external clock pulse in the second bank other than the first one.

According to another aspect of the present invention, there is provided a synchronous semiconductor memory device comprising a plurality of banks, each of the banks comprising a cell array, a first latch circuit means for being supplied with a row selection control signal and outputting a row selection start signal in synchronism with an external clock signal, a delay circuit means for being supplied with the row selection start signal and outputting a sensing operation start signal, a row address decoder for being supplied with a row address signal and the row selection start signal and selecting a row selecting line, a sense amplifier means for being supplied with at least the sensing operation start signal and a signal from a bit line pair, a second latch circuit means for being supplied with a column address signal and selecting a bit line, a write amplifier means for outputting data to be written into the cell array to the sense amplifier means, and a data amplifier means for being supplied with and amplifying read data from the sense amplifier means.

According to still another aspect of the present invention, there is provided a synchronous semiconductor memory device comprising a plurality of banks, each of the banks comprising a cell array, a first latch circuit means for being supplied with a row selection control signal and outputting a row selection start signal in synchronism with an external clock signal, a second latch circuit means for being supplied with the row selection start signal and outputting a sensing operation start signal in synchronism with the external clock signal, a row address decoder means for being supplied with a row address signal and the row selection start signal and selecting a row selecting line, a sense amplifier means for being supplied with at least the sensing operation start signal and a signal from a bit line pair, a third latch circuit means for being supplied with a column address signal and selecting a bit line, a write amplifier means for outputting data to be written into the cell array to the sense amplifier, and a data amplifier means for being supplied with and amplifying read data from the sense amplifier means.

After an active command is inputted to one of the banks, a row selecting line is selected and a differential potential between the bit line pair is amplified in synchronism with the external block signal at a cycle where a read command or the like can be inputted to the other bank. Therefore, noise produced by read operation or the like of the other bank is received with the same timing at all times, not depending on the frequency (cycle time) of the external clock signal. Therefore, synchronous semiconductor memory devices can easily and reliably be sorted out into those acceptable and those defective.

When data is read after the read command is inputted, noise produced by an active operation initiated by an active command or the like that is inputted in a cycle preceding to the read command is also received with the same timing at all times in the read period, not depending on the frequency (cycle time) of the external clock signal.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 4:
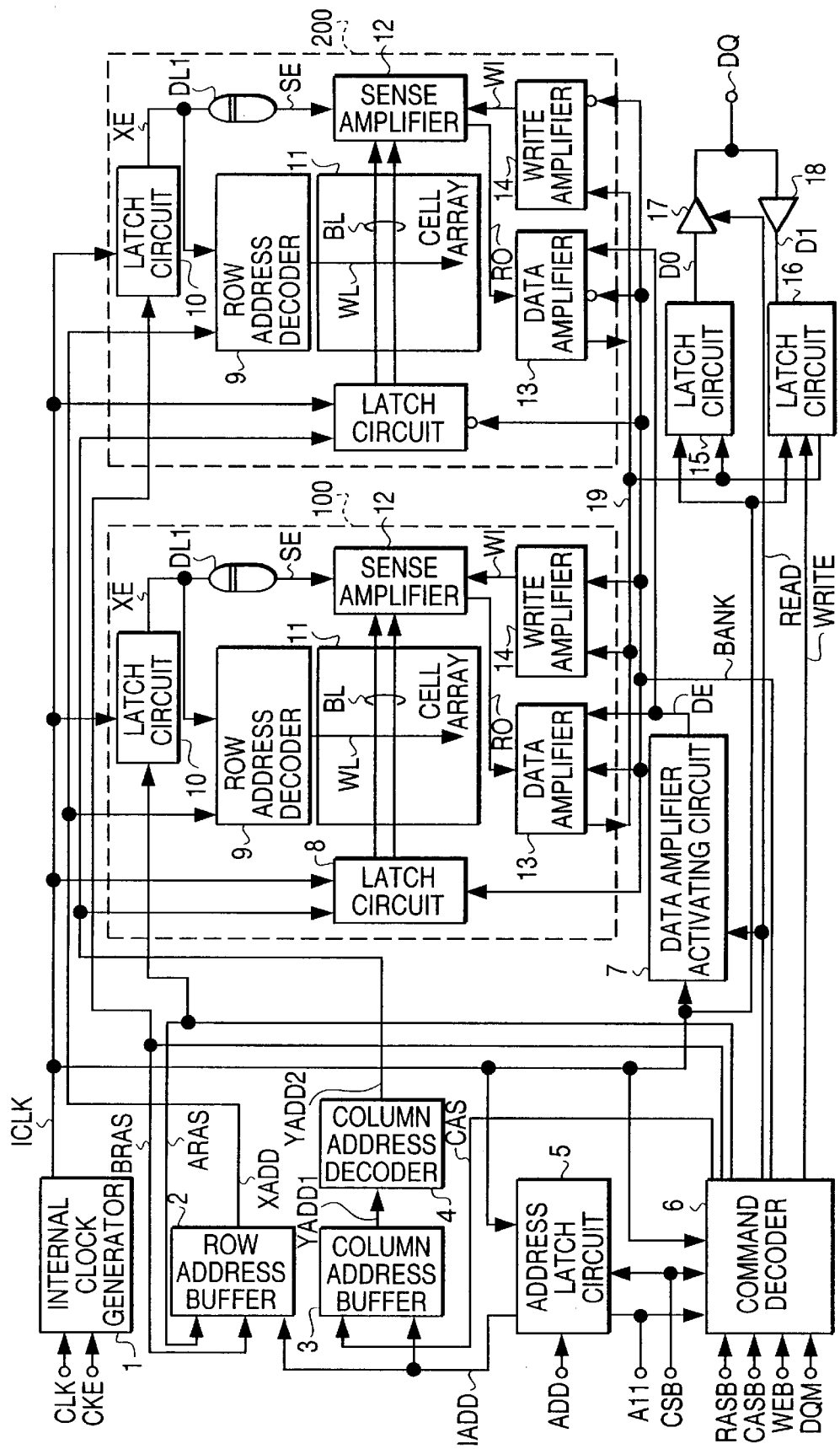
FIG. 4 in response to the external signal waveforms shown in FIG. 2 is a block diagram of a semiconductor memory device of an embodiment of the present invention.

FIG. 4 shows in block form a semiconductor memory device according to an embodiment of the present invention.

As shown in FIG. 4, the semiconductor memory device includes banks 100, 200 that operate concurrently with each other.

The bank 100 comprises a cell array 11, a latch circuit 10 for being supplied with an internal signal ARAS and outputting an internal signal XE in synchronism with an internal clock signal ICLK, a delay element DL1 for being supplied with the internal signal XE and outputting an internal signal SE, a row address decoder 9 for being supplied with an address signal XADD and the internal signal XE and selecting a row selecting line WL, a latch circuit 8 for being supplied with an address signal YADD2 and an internal signal BANK and selecting a bit line pair BL in synchronism with the internal clock signal ICLK, a write amplifier 14 for being supplied with data from an internal bus pair RWBIJS and the internal signal BANK and outputting an internal signal WI, a sense amplifier 12 for being supplied with the internal signals WI, SE and the bit line pair BL and outputting an internal signal RO, and a data amplifier 13 for being supplied with the internal signals RO, DE, BANK and outputting read data to the internal bus pair RWBUS.

The bank 200 is of substantially the same structure as the bank 100 except that the bank 200 is supplied with the internal signal BRAS rather than the internal signal ARAS and with the inverted signal of the internal signal BANK rather than the internal signal BANK. Those parts of the bank 200 which are identical to those of the bank 100 are denoted by identical reference numerals.

Figure 1:
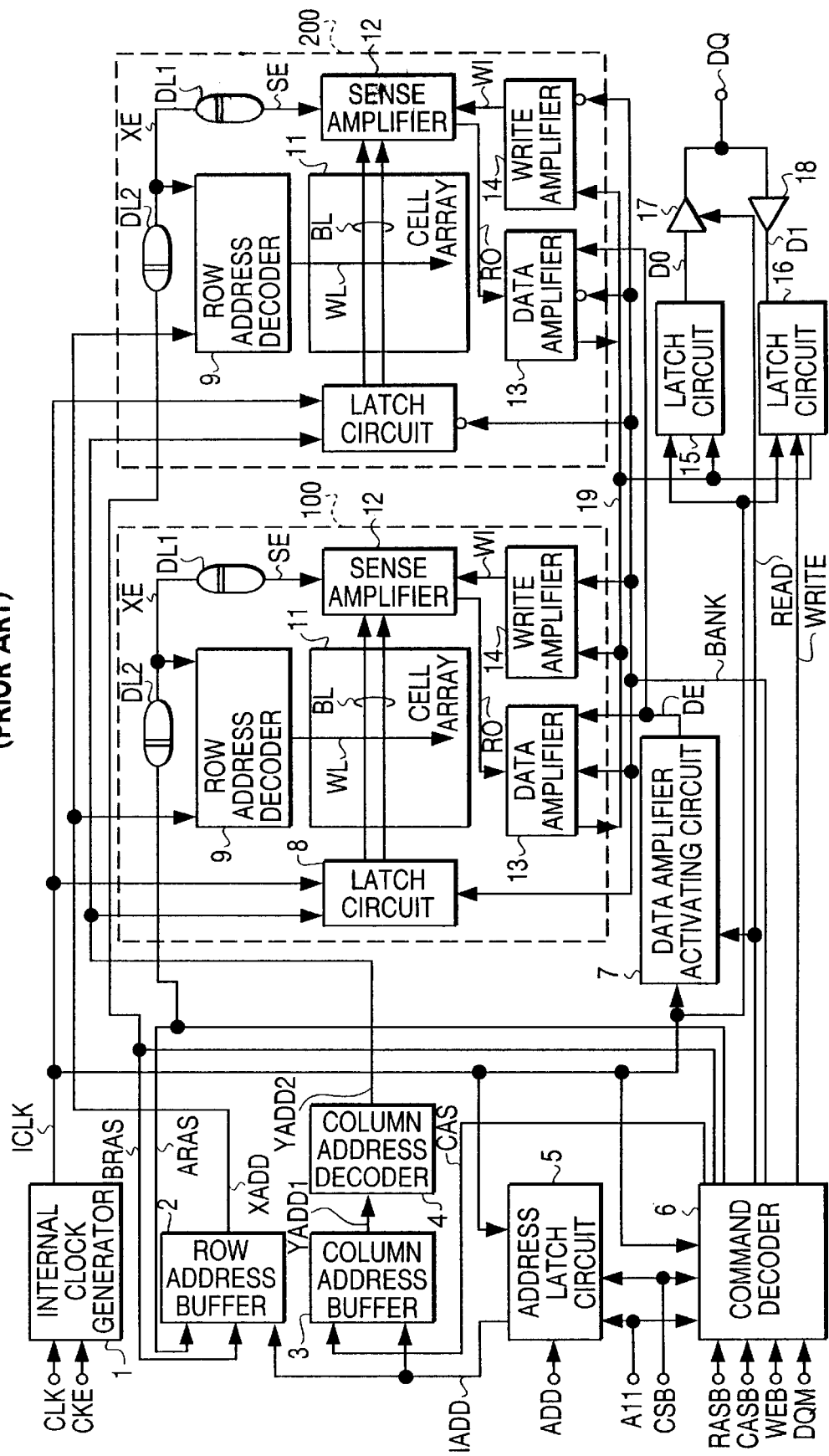
FIG. 1 is a block diagram of a conventional semiconductor memory device.

The other components of the semiconductor memory device shown in FIG. 4, i.e., those other than the banks 100, 200, are identical to those of the conventional semiconductor memory device shown in FIG. 1, and are denoted by identical reference numerals used in FIG. 1.

Operation of the semiconductor memory device shown in FIG. 4 will be described below.

Figure 2:
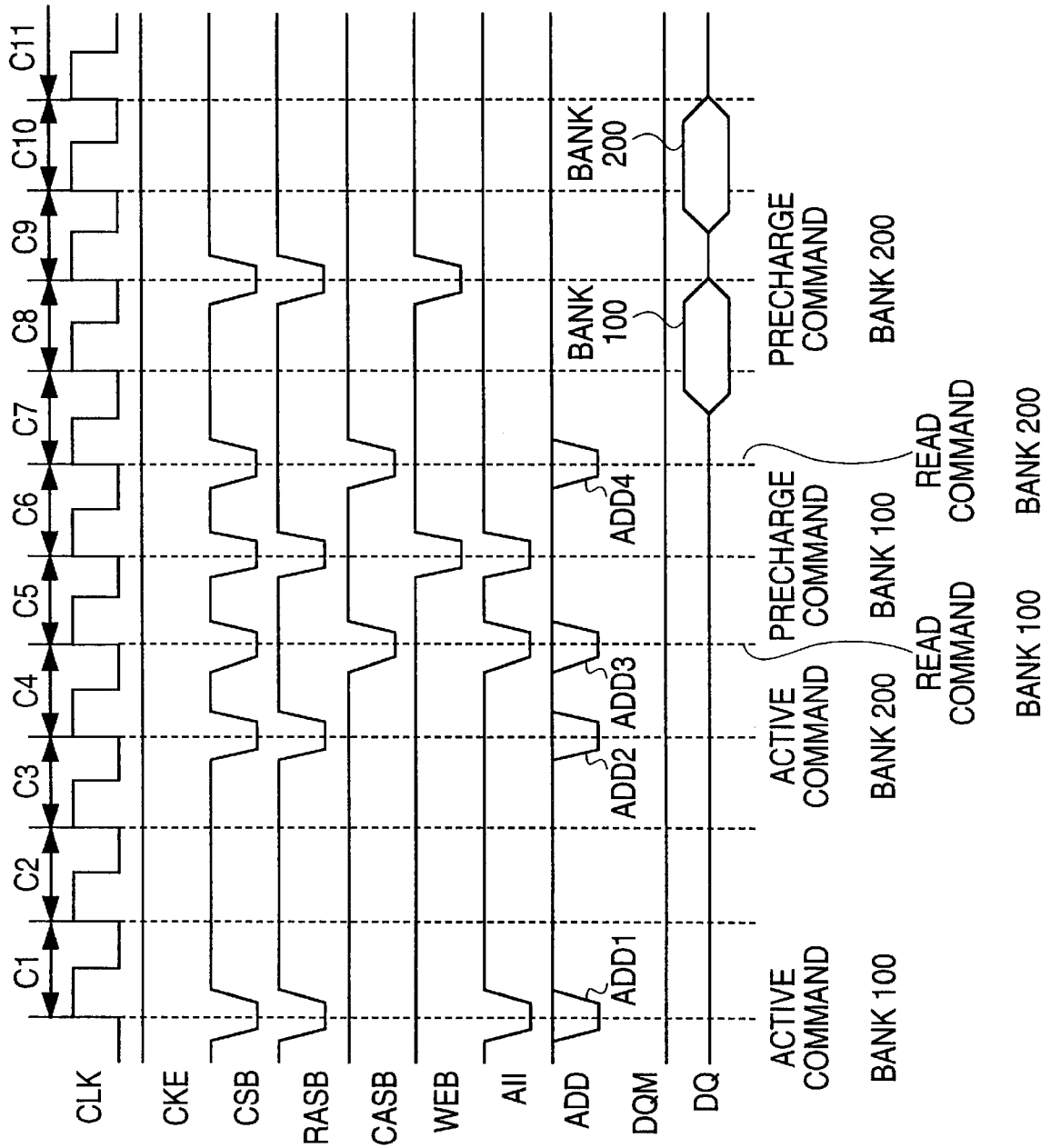
FIG. 2 is a diagram of external signal waveforms, for illustrating operation a semiconductor memory device.
Figure 3:
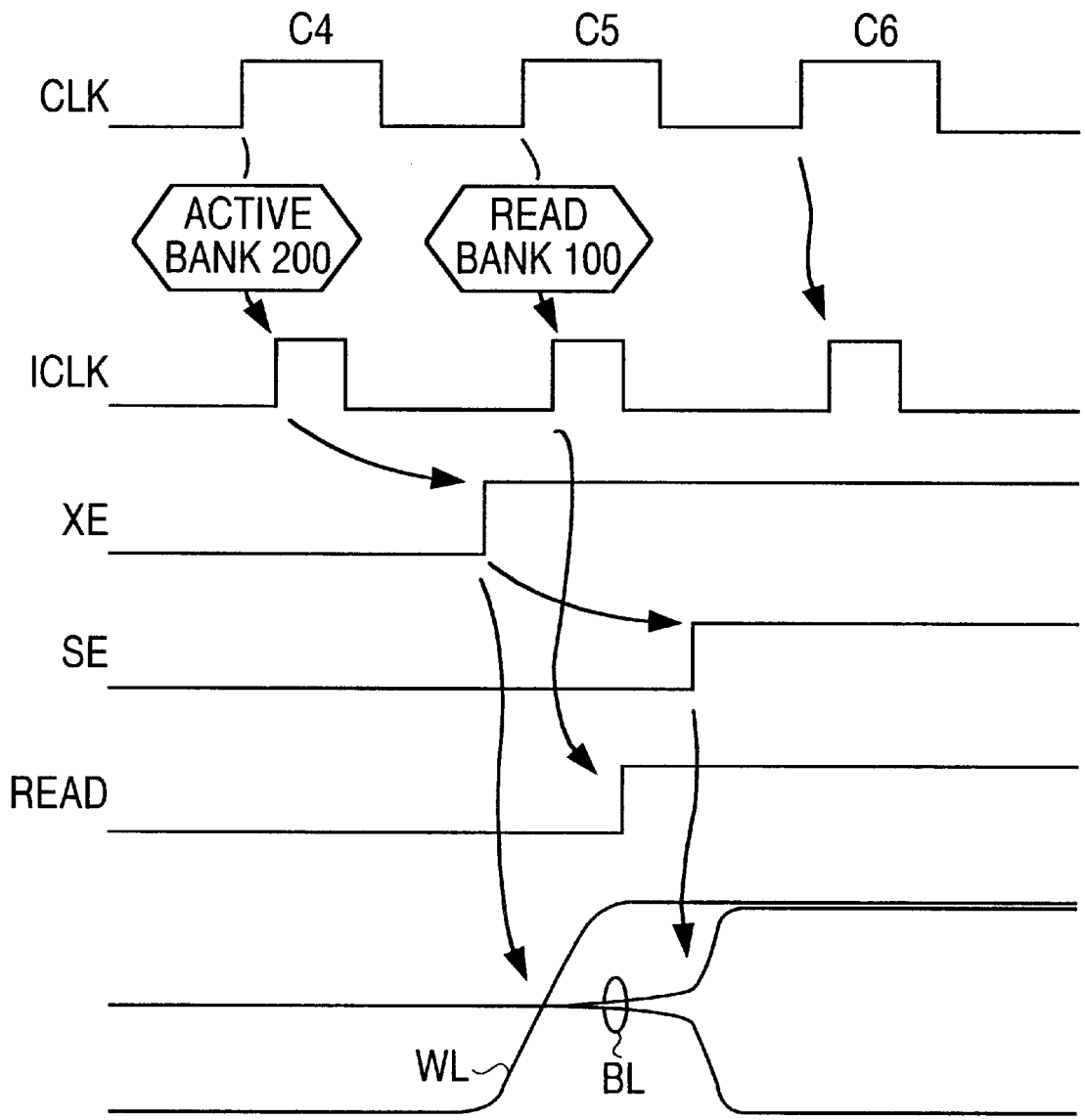
FIG. 3 is a diagram of internal signal waveforms, illustrating operation of the conventional semiconductor memory device shown in FIG. 1, in response to the external signal waveforms shown in FIG. 2.
Figure 5:
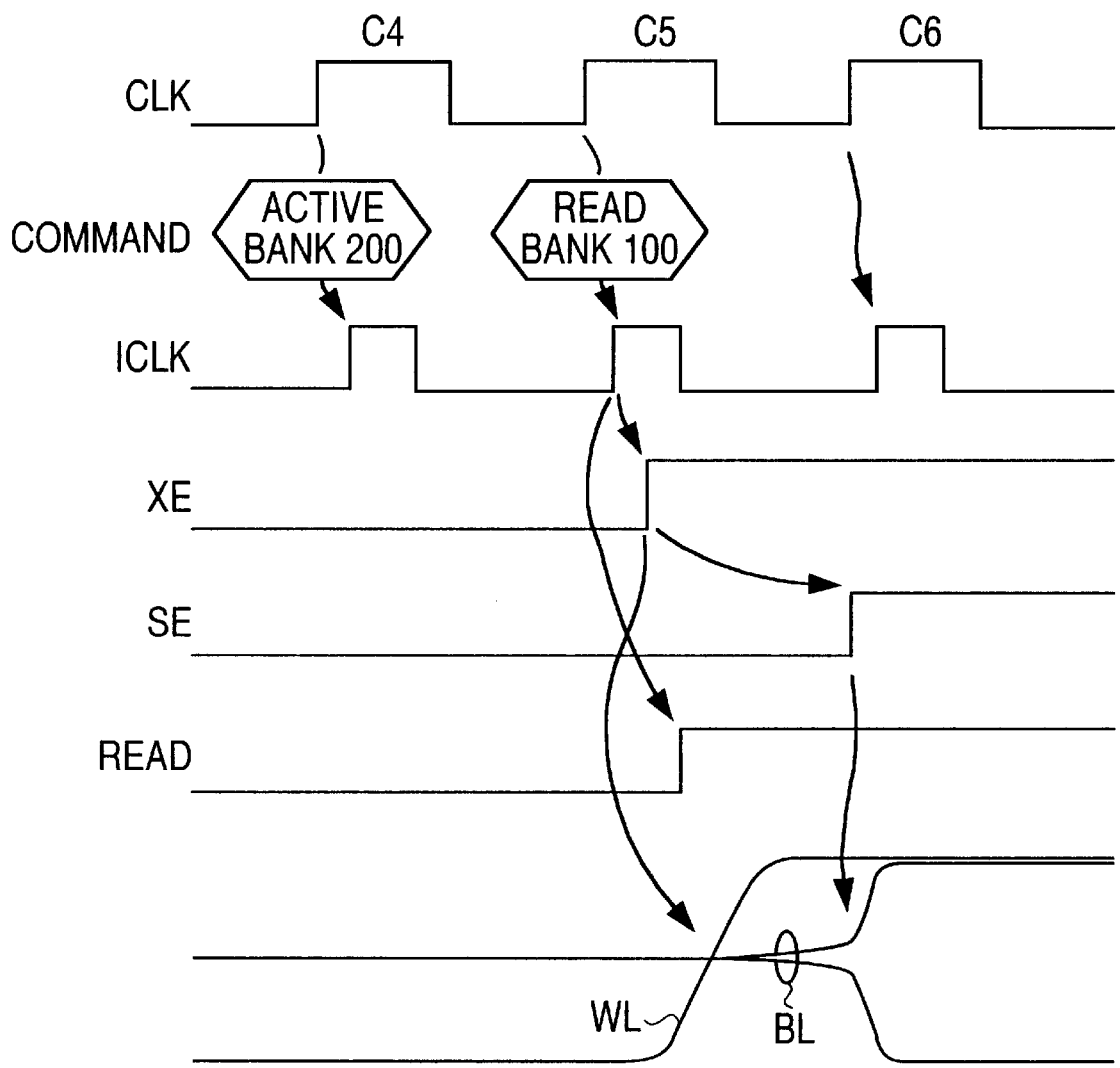
FIG. 5 is a diagram of internal signal waveforms, illustrating operation of the semiconductor memory device according to the embodiment shown in FIG. 4.

FIG. 5 is illustrative of operation of the semiconductor memory device according to the embodiment shown in FIG. 4. FIG. 5 shows the waveforms of internal signals over an interval from a cycle C4 to a cycle C6 in an example of concurrent operation of the two banks in response to the external signals shown in FIG. 2.

After an active command is inputted to the bank 200 in the cycle C4, the internal signal XE goes high in synchronism with the internal clock signal ICLK in a next cycle C5, selecting a row selecting line WL and developing a differential potential depending on the memory cell data between the bit line pair. The internal signal SE then goes high with a certain delay from the internal signal XE, amplifying the differential potential between the bit line pair. When a read command is inputted to the bank 100 in the cycle C5 concurrent with the above sensing operation, the internal signal READ goes high, starting to read data from the bank 100.

Both selecting the row selecting line in the bank 200 to develop a small differential potential between the bit lines and starting to read data from the bank 100 are synchronous with the internal clock signal ICLK in the cycle C5.

Therefore, the effect of noise from the other bank on the small differential potential developed between the bit line pair does not depend on the frequency (cycle time) of the external clock signal, and remains the same at all times.

Because an active operation ranging from the selection of a row selecting line to the completion of a sensing process requires a period of time as long as three cycles of the external clock signal, one cycle of the external clock signal and subsequently a period of time as long as two cycles of the external clock signal are needed for the active operation in this embodiment.

The time required by the active operation is the same as that in the conventional semiconductor memory device shown in FIG. 1, and it is customary to keep the external clock clocked (to operate at a fixed frequency) in the active operation. Therefore, the ease of using the semiconductor memory device according to this embodiment and the performance thereof are not worse than the conventional semiconductor memory device shown in FIG. 1.

Figure 6:
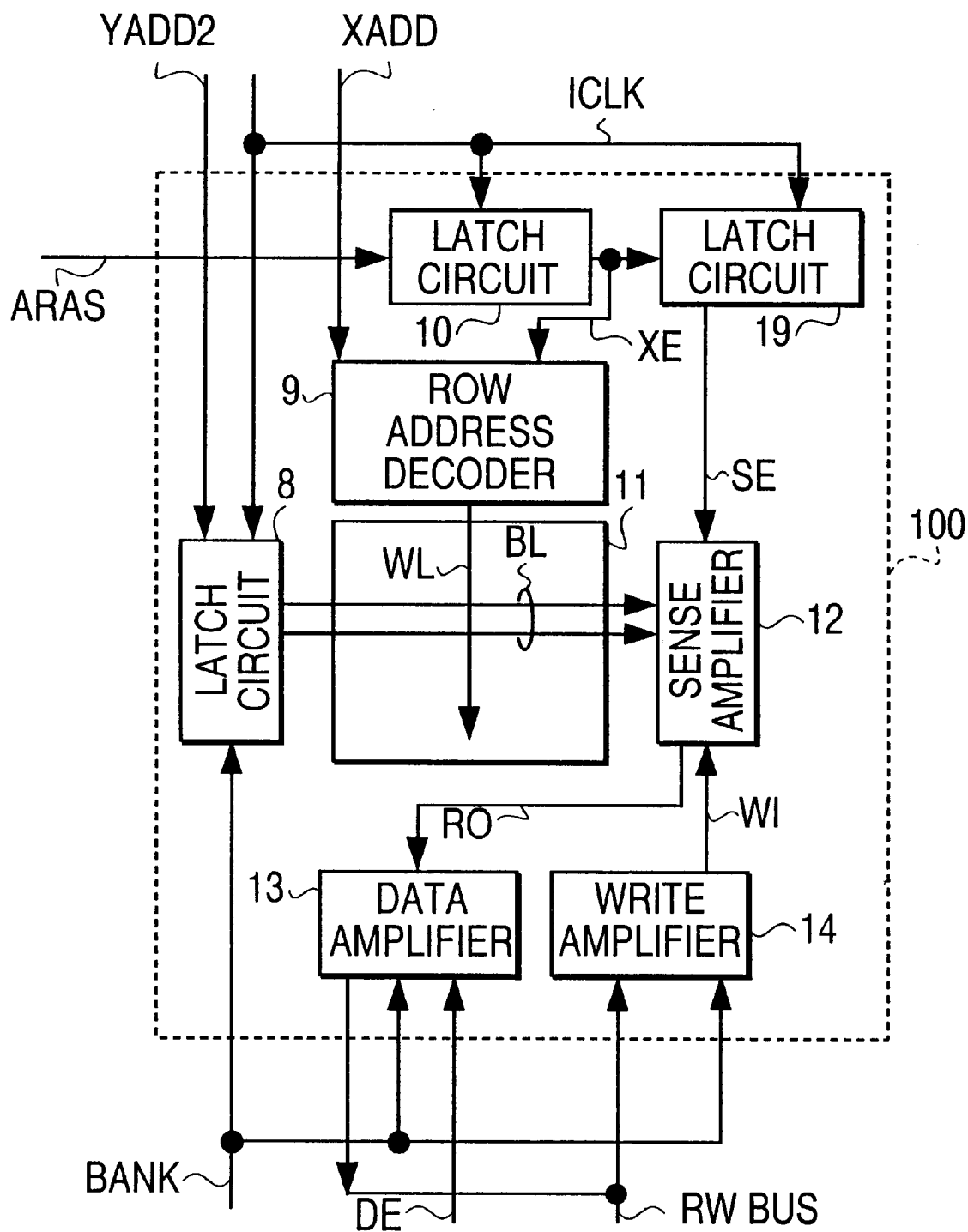
FIG. 6 is a block diagram of a semiconductor memory device according to another embodiment of the present invention.

FIG. 6 shows in block form a semiconductor memory device according to another embodiment of the present invention.

As shown in FIG. 6, the semiconductor memory device includes banks 100, 200 that operate concurrently with each other.

The bank 100 comprises a cell array 11, a latch circuit 10 for being supplied with an internal signal ARAS and outputting an internal signal XE in synchronism with an internal clock signal ICLK, a latch circuit 19 for being supplied with the internal signal XE and outputting an internal signal SE in synchronism with the internal clock signal ICLK, a row address decoder 9 for being supplied with an address signal XADD and the internal signal XE and selecting a row selecting line WL, a latch circuit 8 for being supplied with an address signal YADD2 and an internal signal BANK and selecting a bit line pair BL in synchronism with the internal clock signal ICLK, a write amplifier 14 for being supplied with data from an internal bus pair RWBUS and the internal signal BANK and outputting an internal signal WI, a sense amplifier 12 for being supplied with the internal signals WI, SE and the bit line pair BL and outputting an internal signal RO, and a data amplifier 13 for being supplied with the internal signals RO, DE, BANK and outputting read data to the internal bus pair RWBUS.

The bank 200, not shown in FIG. 6, is of substantially the same structure as the bank 100 except that the bank 200 is supplied with the internal signal BRAS rather than the internal signal ARAS and with the inverted signal of the internal signal BANK rather than the internal signal BANK.

The other components of the semiconductor memory device shown in FIG. 6, i.e., those other than the banks 100, 200, are identical to those of the conventional semiconductor memory device shown in FIG. 1.

Operation of the semiconductor memory device shown in FIG. 6 will be described below.

Figure 7:
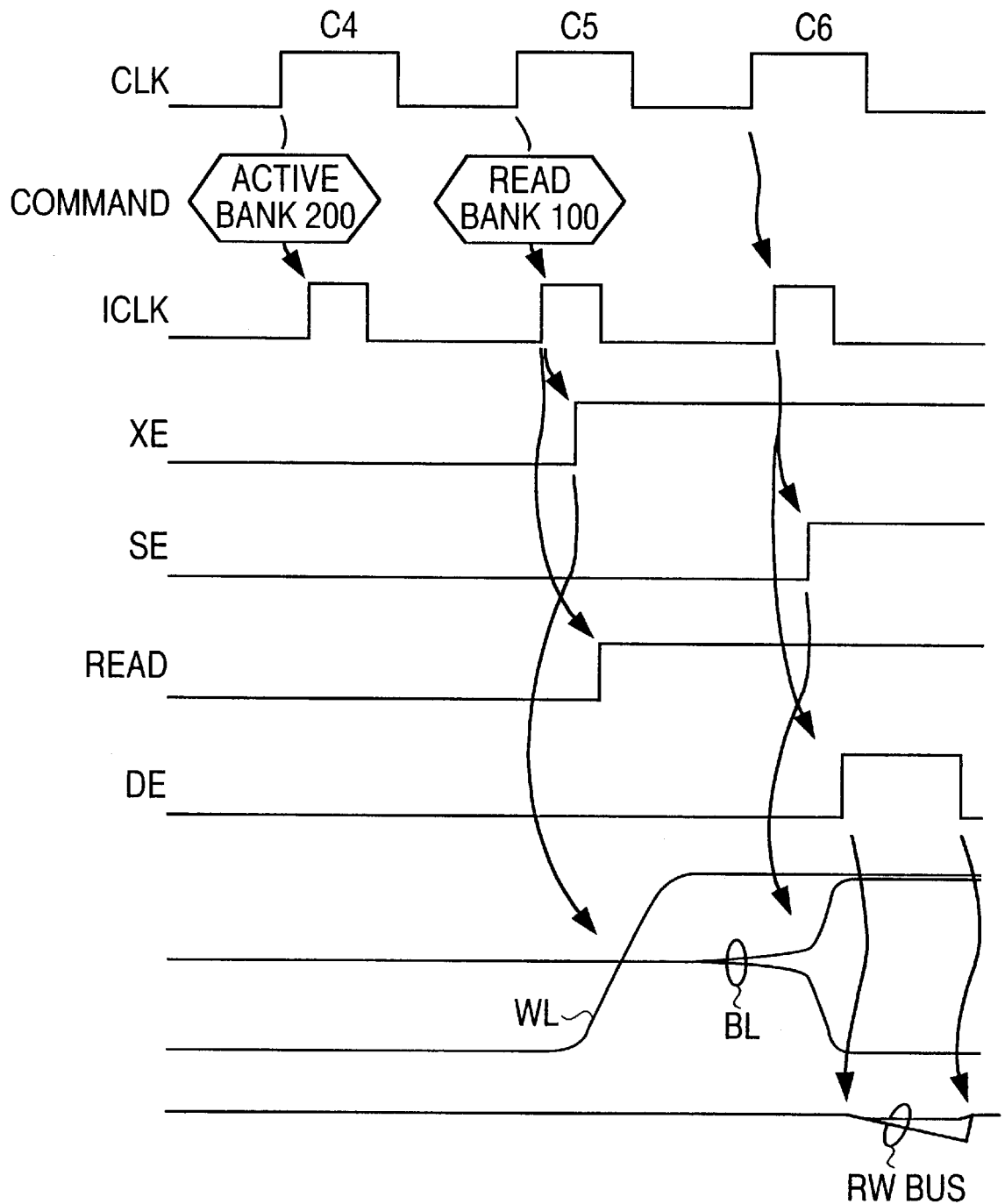
FIG. 7 is a diagram of internal signal waveforms, illustrating operation of the semiconductor memory device according to the embodiment shown in FIG. 6 in response to the external signal waveforms shown in FIG. 2.

FIG. 7 is illustrative of operation of the semiconductor memory device according to the embodiment shown in FIG. 6. FIG. 7 shows the waveforms of internal signals over an interval from a cycle C4 to a cycle C6 in an example of concurrent operation of the two banks in response to the external signals shown in FIG. 2.

After an active command is inputted to the bank 200 in the cycle C4, the internal signal XE goes high in synchronism with the internal clock signal ICLK in a next cycle C5, selecting a row selecting line WL and developing a differential potential depending on the memory cell data between the bit line pair. In the cycle 6, the internal signal SE then goes high in synchronism with the internal clock signal ICLK, amplifying the differential potential between the bit line pair. When a read command is inputted to the bank 100 in the cycle C5 concurrent with the above sensing operation, the internal signal READ goes high, starting to read data from the bank 100. The internal signal DE goes high in synchronism with the internal clock signal ICLK in the cycle C6, activating the data amplifier 13. When the data amplifier 13 is activated, the read data is transmitted to the internal bus pair RWBUS.

For speeding up the reading of data, the data on the internal bus pair RWBUS is transmitted with a small differential potential between the buses of the internal bus pair RWBUS, and amplified by the latch circuit 15 to which the internal bus pair RWBUS is connected. While the data on the internal bus pair RWBUS may possibly be inverted by noise caused by the sensing operation of the other bank that operates concurrently, since the sensing operation initiated by the internal signal SE is synchronous with the internal clock signal ICLK in the cycle C6, the effect of the noise does not depend on the frequency (cycle time) of the external clock signal.

In this embodiment, two cycles of the external clock signal and subsequently a period of time as long as one cycle of the external clock signal are needed for the active operation.

Although each of the semiconductor memory devices according to the present invention has been described as having two banks, the principles of the present invention are also applicable to a semiconductor memory device having three or more banks.

While preferred embodiments of the present invention have been described using specific terms, such description is for illustrative purposes only, and it is to be understood that changes and variations may be made without departing from the spirit or scope of the following claims.

What is claimed is:

1. A synchronous semiconductor memory device comprising a plurality of banks, each of said banks comprising:
   a cell array;
   a latch circuit for receiving a row selection control signal and outputting a row selection start signal in synchronism with an external clock signal;
   a delay circuit for receiving said row selection start signal and outputting a sensing operation start signal;
   a row address decoder for receiving a row address signal and said row selection start signal and selecting a row selecting line;
   a sense amplifier for receiving at least said sensing operation start signal and a signal from a bit line pair;
   a circuit for receiving a column address signal and selecting a bit line;
   a write amplifier for outputting data to be written into said cell array to said sense amplifier; and
   a data amplifier receiving and amplifying read data from said sense amplifier.

2. A synchronous semiconductor memory device comprising a plurality of banks, each of said banks comprising:

a cell array;

a first latch circuit for receiving a row selection control signal and outputting a row selection start signal in synchronism with an external clock signal;

a second latch circuit for receiving said row selection start signal and outputting a sensing operation start signal in synchronism with said external clock signal;

a row address decoder for receiving a row address signal and said row selection start signal and selecting a row selecting line;

a sense amplifier for receiving at least said sensing operation start signal and a signal from a bit line pair;

a circuit for receiving a column address signal and selecting a bit line;

a write amplifier for outputting data to be written into said cell array to said sense amplifier; and a data amplifier receiving and amplifying read data from said sense amplifier.

3. A method of controlling a synchronous semiconductor memory device having a plurality of memory banks including at least a first and a second memory bank, comprising the steps of:

activating said first memory bank in response to a first external clock pulse;

generating a read control signal in response to a second external clock pulse subsequent to said first external clock pulse;

generating a row address selecting signal in response to said second external clock pulse;

generating a sense control signal in response to said row address selecting signal;

starting a read operation of said second memory bank in response to said read control signal;

starting a row selecting operation of said first memory bank in response to said row address selecting signal; and starting a sensing operation of said first memory bank in response to said sense control signal.

4. A method of controlling a synchronous semiconductor memory device having a plurality of memory banks including at least a first and a second memory bank, comprising the steps of:

activating said first memory bank in response to a first external clock pulse;

generating a read control signal in response to a second external clock pulse subsequent to said first external clock pulse;

generating a row address selecting signal in response to said second external clock pulse;

generating a sense control signal in response to a third external clock pulse subsequent to said second external clock pulse;

starting a read operation of said second memory bank in response to said read control signal;

starting a row selecting operation of said first memory bank in response to said row address selecting signal; and starting a sensing operation of said first memory bank in response to said sense control signal.

* * * * *